United States Patent
Herb

(10) Patent No.: US 10,144,292 B2
(45) Date of Patent: Dec. 4, 2018

(54) SANITY MONITOR FOR POWER MODULE

(71) Applicant: NIO USA, Inc., San Jose, CA (US)

(72) Inventor: Robert Herb, Morgan Hill, CA (US)

(73) Assignee: NIO USA, Inc., San Jose, CA (US)

( * ) Notice: Subject to any disclaimer, the term of this patent is extended or adjusted under 35 U.S.C. 154(b) by 0 days.

(21) Appl. No.: 15/393,527

(22) Filed: Dec. 29, 2016

(65) Prior Publication Data

US 2018/0111484 A1   Apr. 26, 2018

Related U.S. Application Data

(60) Provisional application No. 62/412,484, filed on Oct. 25, 2016.

(51) Int. Cl.
| | |
|---|---|
| *B60L 3/00* | (2006.01) |
| *G01R 31/00* | (2006.01) |
| *G01R 31/26* | (2014.01) |
| *B60L 3/12* | (2006.01) |
| *B60L 15/20* | (2006.01) |
| *B60L 3/04* | (2006.01) |

(52) U.S. Cl.
CPC ............. *B60L 3/0023* (2013.01); *B60L 3/04* (2013.01); *B60L 3/12* (2013.01); *B60L 15/20* (2013.01); *G01R 31/007* (2013.01); *G01R 31/2608* (2013.01); *G01R 31/2621* (2013.01)

(58) Field of Classification Search
CPC .. B60L 3/0023; B60L 3/04; B60L 3/12; B60L 15/20; G01R 31/007; G01R 31/2608; G01R 31/2621
See application file for complete search history.

(56) References Cited

U.S. PATENT DOCUMENTS

| | | | | |
|---|---|---|---|---|
| 5,598,107 A | * | 1/1997 | Cabuk | H03K 17/163 326/17 |
| 5,712,857 A | * | 1/1998 | Whitman | G01R 31/3004 324/762.02 |
| 5,877,647 A | * | 3/1999 | Vajapey | H03F 1/523 326/27 |

(Continued)

FOREIGN PATENT DOCUMENTS

| | | | |
|---|---|---|---|
| DE | 102007024175 A1 | * 12/2008 | ......... G01R 31/2621 |
| JP | 09163592 A | * 6/1997 | |

*Primary Examiner* — Tuan C To
(74) *Attorney, Agent, or Firm* — Sheridan Ross P.C.

(57) ABSTRACT

Described herein is a method and sanity monitoring system for power modules that detect abnormal conditions with respect to transistors in the power modules. A sanity monitor is added to each transistor. The sanity monitor can include a sensor that detects voltage, current, temperature, magnetic fields or similar parameters that indicate a health of a transistor. A failure handling device receives measurements from the sanity monitors and determines whether the measured parameters are within expected ranges for the transistors. If an abnormality is detected, the failure handling device performs a corrective action. For example, the failure handing device can reduce the overall current in a power stage to prevent remaining transistors from failing. The failure handling device additionally informs the driver, (e.g., via an input/output (I/O) device), of the problem, indicating that the driver should bring the car to service.

23 Claims, 3 Drawing Sheets

(56) References Cited

U.S. PATENT DOCUMENTS

| | | | | |
|---|---|---|---|---|
| 5,898,321 | A * | 4/1999 | Ilkbahar | H03K 17/164 326/30 |
| 6,420,913 | B1 * | 7/2002 | Ang | H03K 19/00384 327/108 |
| 2002/0047165 | A1 * | 4/2002 | Casper | H01L 27/0288 257/379 |
| 2005/0248360 | A1 * | 11/2005 | Patel | G01R 31/40 324/762.09 |
| 2006/0214426 | A1 * | 9/2006 | Asao | H02P 9/305 290/31 |
| 2006/0221525 | A1 * | 10/2006 | Konishi | H02J 7/1461 361/93.1 |
| 2006/0232903 | A1 * | 10/2006 | Krabbenborg | H03K 17/0826 361/103 |
| 2007/0040571 | A1 * | 2/2007 | Dolian | G01R 31/2621 324/759.03 |
| 2007/0103001 | A1 * | 5/2007 | Chiozzi | H03K 17/04106 307/10.1 |
| 2008/0007243 | A1 * | 1/2008 | Matsumoto | G05F 3/30 323/313 |
| 2009/0066404 | A1 * | 3/2009 | Heppenstall | G01K 7/01 327/513 |
| 2013/0271056 | A1 * | 10/2013 | Bunte | F03D 7/0224 318/503 |
| 2013/0279225 | A1 * | 10/2013 | Choi | H02M 7/53873 363/98 |
| 2013/0314014 | A1 * | 11/2013 | Tremel | H02M 7/53871 318/400.22 |
| 2013/0320903 | A1 * | 12/2013 | Aalund | G01R 31/343 318/490 |
| 2014/0023110 | A1 * | 1/2014 | Hamanaka | G01K 13/00 374/142 |
| 2014/0266222 | A1 * | 9/2014 | Baughman | H02J 7/0021 324/426 |
| 2016/0020688 | A1 * | 1/2016 | Osanai | H03K 17/795 327/109 |
| 2016/0134212 | A1 * | 5/2016 | Kikuchi | B62D 5/0484 318/400.21 |
| 2016/0207403 | A1 * | 7/2016 | Iida | B60L 11/02 |
| 2017/0106852 | A1 * | 4/2017 | Ando | B60K 6/365 |

* cited by examiner

SANITY MONITOR FOR POWER MODULE

CROSS REFERENCE TO RELATED APPLICATIONS

This application claims the benefit both of U.S. Provisional Patent Application Ser. No. 62/412,484, filed Oct. 25, 2016, which is incorporated by reference as if fully set forth.

FIELD OF INVENTION

This application is related to power modules and in particular, to a sanity monitor for a power module which detects abnormal voltage and/or current conditions with respect to transistors in the power module.

BACKGROUND

Electric vehicles include a variety of electrical circuitry to control and regulate the delivery of stored electrical energy from a battery pack to an electric motor. In particular, inverters are used to convert electricity derived from a Direct Current (DC) source, such as the battery pack, to Alternating Current (AC) that can be used to drive the electrical motor. These inverters include power modules, which in turn consist of a multitude of transistors. When a transistor in a power module breaks, the load needs to be carried by the remaining transistors. Usually the remaining transistors get overloaded and break as well. The result is loss of drive for the vehicle. This is severe as it happens without early warning to the driver of the electric vehicle.

SUMMARY

Described herein is a method and sanity monitoring system for power modules that detect abnormal voltage and/or current conditions with respect to transistors in the power modules. A sanity monitor is added to each transistor. The sanity monitor can include a sensor that detects voltage, current, temperature, magnetic fields or similar parameters that indicate a health of a transistor. A failure handling device, (e.g., a controller, microcontroller, computer, processor, and the like), receives measurements from the sanity monitors and determines whether the measured parameters are within expected ranges for the transistors. If an abnormality is detected, (e.g., an abnormal current, voltage, and the like), the failure handling device performs a corrective action. For example, the failure handling device can reduce the overall current in a power stage to prevent remaining transistors from failing. The failure handling device additionally informs the driver, (e.g., via an input/output (I/O device), of the problem, indicating that the driver should bring the car to service.

BRIEF DESCRIPTION OF THE DRAWING(S)

The foregoing Summary and the following detailed description will be better understood when read in conjunction with the appended drawings, which illustrate a preferred embodiment of the invention. In the drawings.

DETAILED DESCRIPTION

Described herein is a method and system for implementing sanity monitors in power modules. The sanity monitors can detect abnormal conditions with respect to the transistors that are in the power modules. That is, the sanity monitor of each transistor supervises the correct switching of the respective transistor by measuring a transistor parameter during operation of a power stage. In particular, a sanity monitor can be added to each transistor. The sanity monitor can include direct or indirect sensor(s) that detect voltage, current, temperature, magnetic fields and other similar parameters that indicate a health of a transistor. A failure handling device, (e.g., a controller, microcontroller, computer, processor, and the like), receives measurements from the sanity monitors and determines whether the measured parameters are within expected ranges for the transistors. If an abnormality is detected, (e.g., an abnormal current, abnormal voltage, and the like), the failure handling device performs a corrective action. For example, the failure handling device can reduce the overall current in a power stage to prevent remaining transistors from failing. The failure handling device additionally informs the driver, (e.g., via an input/output (I/O device), of the problem, indicating that the driver should bring the car to service.

Figure 1:
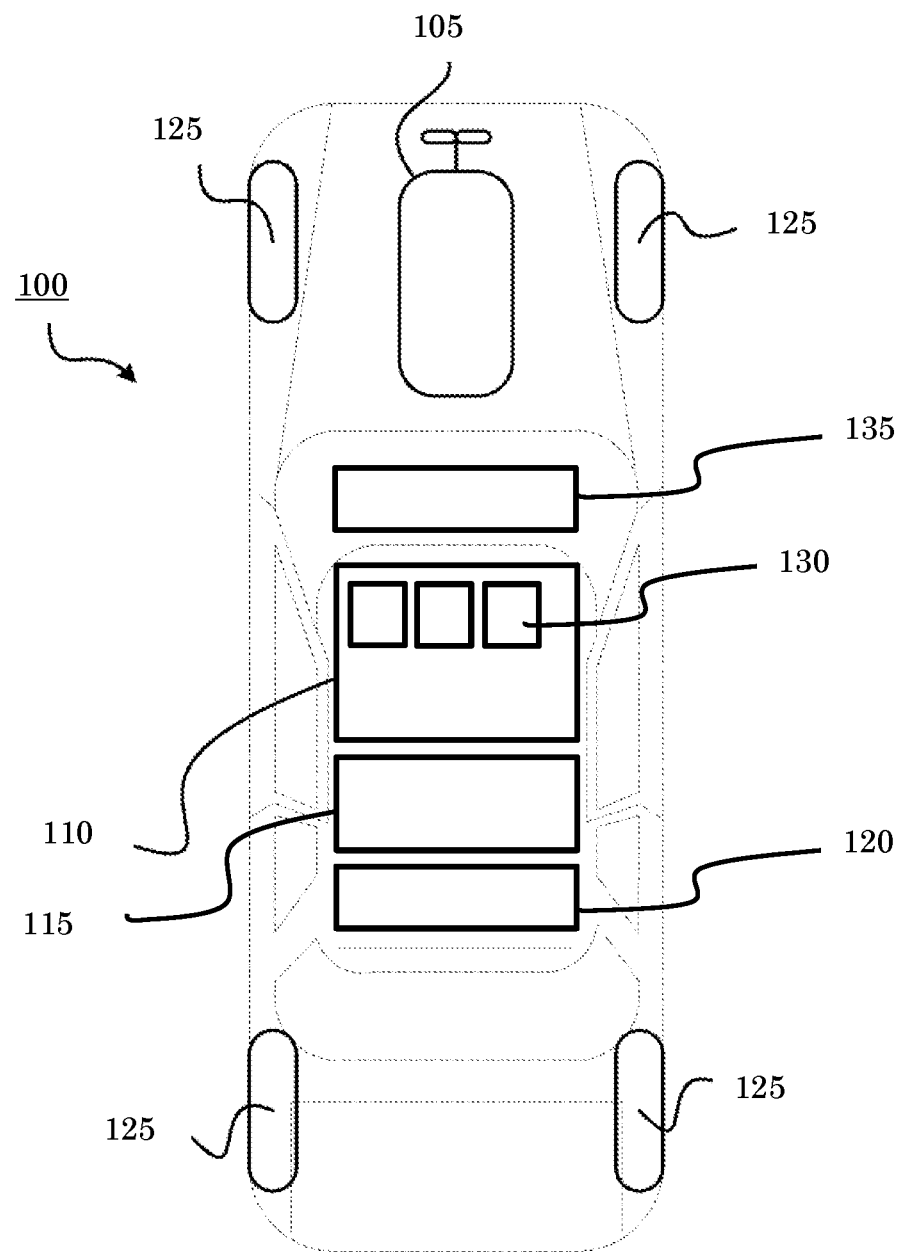
FIG. 1 is a schematic illustration of an electric vehicle including an inverter and power modules in accordance with certain implementations.

FIG. 1 is a schematic illustration of an electric vehicle 100. The electric vehicle 100 includes an electric motor 105, an inverter system 110 including power modules 130, a battery pack system 115 and a control system 120. The electric motor 105 is powered by energy stored by the battery pack system 115 and converted by the inverter system 110 to propel the electric vehicle 100 via a plurality of traction devices 125. In an implementation, the battery pack system 115 is an electrical storage system including various components which allow for the storage and delivery of electrical energy, (via the inverter system 110), to the electric motor 105 and/or receipt of electrical energy from the electric motor 105 or other vehicle system (e.g., through regenerative braking). The battery pack system 115 can include additional components, including busbars, wiring, physical connectors, and the like, which allow battery pack system 115 to be operational in conjunction with inverter system 110 and electric vehicle 100.

The control system 120 is operatively connected to the battery pack system 115, electric motor 105, and the inverter system 110. The control system 120 can include a controller that includes, for example, a processor, memory, I/O device(s), database and the like. The control system 120 can be included in a vehicle on-board computer. The control system 120 is configured to control motor power, internal systems and provide alerts and notifications to a driver of the electric vehicle via an input/output device 135, such as an a heads-up display, digital gauges, navigation system, entertainment system and other similar devices.

The electric vehicle 100 also includes other vehicle components not shown, including typical components for electronic vehicles such as steering components, passenger comfort electronics, driver controls, signaling, and the like. While an electric vehicle 100 is shown and described herein, it should be understood that the disclosed implementations are applicable to other systems.

Figure 2:
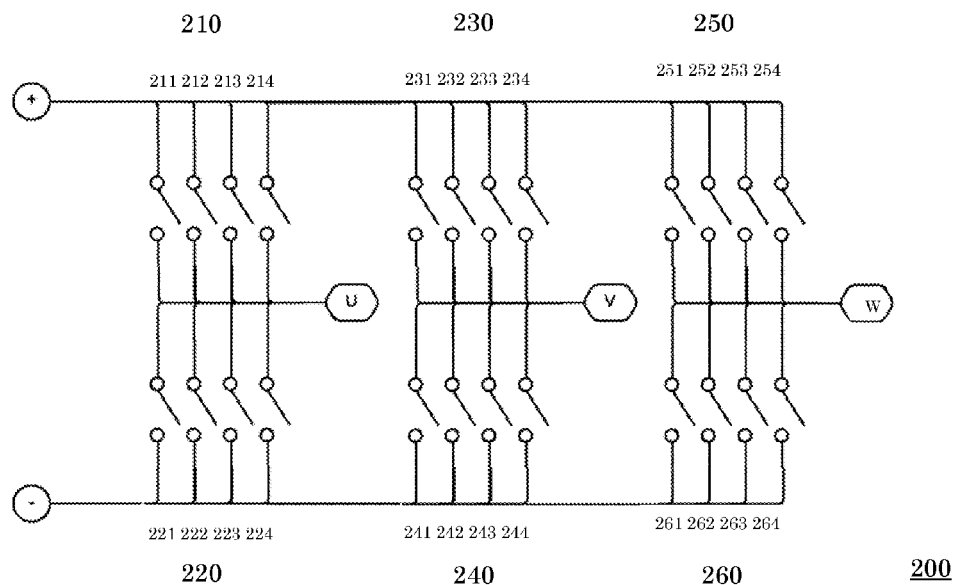
FIG. 2 is an illustrative block diagram of an inverter circuit.

FIG. 2 is an illustrative block diagram of an inverter circuit 200 in a power module. In general, the inverter circuit 200 generates a three-phase alternating voltage for activating electric motor 105. The three phases are designated U, V and W. The inverter circuit 200 can be implemented in a variety of circuit configurations such as a B6 configuration. Although the description herein is with respect to the B6 configuration, other configurations can be used without departing from the scope of the specification and claims.

In the B6 configuration, the inverter circuit 200 includes three sets of a high-voltage-side switching element paired with or connected to a low-voltage-side switching element, one set for each motor phase. For example, high-voltage-side switching element 210 and low-voltage-side switching element 220 are associated with motor phase U, high-voltage-side switching element 230 and low-voltage-side switching element 240 are associated with motor phase V and high-voltage-side switching element 250 and low-voltage-side switching element 260 are associated with motor phase W. Each of the high-voltage-side switching elements 210, 230, and 250 and the low-voltage-side switching elements 220, 240 and 260 can be implemented using multiple transistors which are in connected in parallel. Although a bank of four transistors are shown, it is illustrative and other configurations can be used without departing from the scope of the specification and claims. In an example, high-voltage-side switching element 210 includes transistors 211-214, high-voltage-side switching element 230 includes transistors 231-234, high-voltage-side switching element 250 includes transistors 251-254, low-voltage-side switching element 220 includes transistors 221-224, low-voltage-side switching element 240 includes transistors 241-244, and low-voltage-side switching element 260 includes transistors 261-264. Each of the transistors 211-214, 221-224, 231-234, 241-244, 251-254 and 261-264 can be implemented using insulated-gate bipolar transistor (IGBT) or metal-oxide-semiconductor field-effect transistor (MOSFET) devices in silicon, silicon carbide or other technology, by way of non-limiting example only. When a transistor in such a configuration breaks, the load needs to be carried by the remaining transistors. In this situation, the remaining transistors can get overloaded and break as well. The result is loss of power and drive for the electric vehicle. This can be severe as it happens without early warning to the driver of the electric vehicle.

Figure 3:
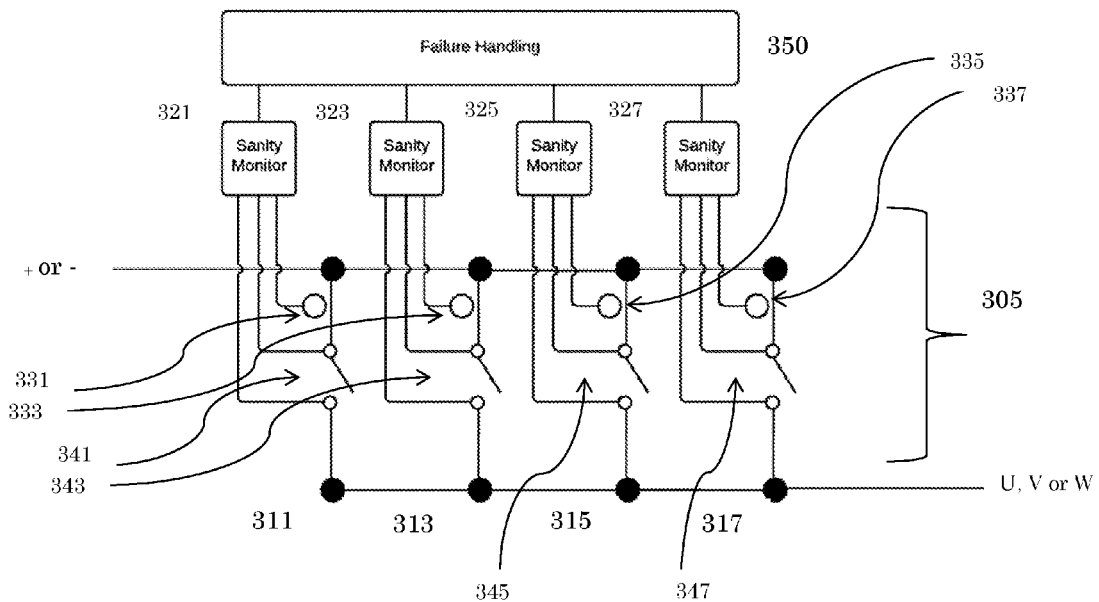
FIG. 3 is an illustrative block diagram of an inverter circuit with a sanity monitor in accordance with certain implementations.

FIG. 3 is an illustrative block diagram of a sanity monitoring system 300 in accordance with certain implementations. The sanity monitoring system includes a switching element 305, which for example is in the power module 130 of FIG. 1. Although only one switching element 305 is shown in FIG. 3, it is illustrative and multiple switching elements can be used without departing from the scope of the specification and claims. The switching element 305 can be implemented with four transistors 311, 313, 315 and 317, which are connected in parallel, for example. The switching element 305 can be a high-voltage-side switching element or a low-voltage-side switching element depending on whether transistors 311-317 are connected to a positive (+) or negative (−) supply. The transistors 311-317 can be associated with one of the three motor phases U, V or W.

Each of the transistors 311-317 is further connected to or associated with (collectively "connected") sanity monitors 321, 323, 325 and 327, respectively. Although four sanity monitors 321, 323, 325 and 327 are shown, it is illustrative and one sanity monitor can be used without departing from the scope of the specification and claims. The sanity monitors 321, 323, 325 and 327 directly or indirectly measure a transistor parameter to determine an abnormal condition. For example, the transistor parameter can be voltage, current, temperature, magnetic field or other similar transistor parameter. FIG. 3 illustrates that each sanity monitor 321, 323, 325 and 327 includes a current sensor 331, 333, 335, and 337 and a voltage sensor 341, 343, 345, and 347. This is illustrative and the sanity monitor can measure one or more transistor parameters without departing from the scope of the specification and claims. Each of the sanity monitors 321, 323, 325 and 327 is further connected to a failure handling device 350. The failure handling device 350 can be a controller, microcontroller, computer, processor, and other similar device. In an implementation, failure handling device 350 can be implemented in control system 120.

The failure handling device 350 can receive measurements from the sanity monitors 321, 323, 325 and 327 and determine whether the measured transistor parameter(s) are within expected ranges. If an abnormality is detected, (e.g. abnormal current, voltage, temperature and the like), in one or more of the transistors, (e.g. transistors 311, 313, 315 and 317), the failure handling device 350 can perform a corrective action. In an illustrative example, the failure handling device 350 can reduce the overall current in a power stage to help prevent normally working transistors from breaking and/or stop activating the transistor(s) which has shown abnormal parameters. In an implementation, the failure handling device 350 can reduce the operating current by predetermined amounts or percentages depending on the number of broken transistors. In an implementation, the failure handling device 350 can reduce the operating current to a first level for a given number of broken transistors and to a second level for additional broken transistors. In an implementation, the second level can be a limp mode, where the electric vehicle 100 is operating with reduced torque. For example, if a nominal operating current for the electric vehicle 100 is 1000 AMPs, then the failure handling device 350 can reduce the operating current to 750 AMPs if the number of broken transistors is less than or equal to a predetermined threshold and to 500 AMPs if the number of broken transistors is greater than the predetermined threshold. In an implementation, the failure handling device 350 can inform a driver (e.g., via the I/O device 135) of the problem so that the driver can bring the car in for service. Utilization of the sanity monitor allows the power module to remain functional even with a defective transistor(s), resulting in no immediate loss of drive and providing early warning to a driver.

Figure 4:
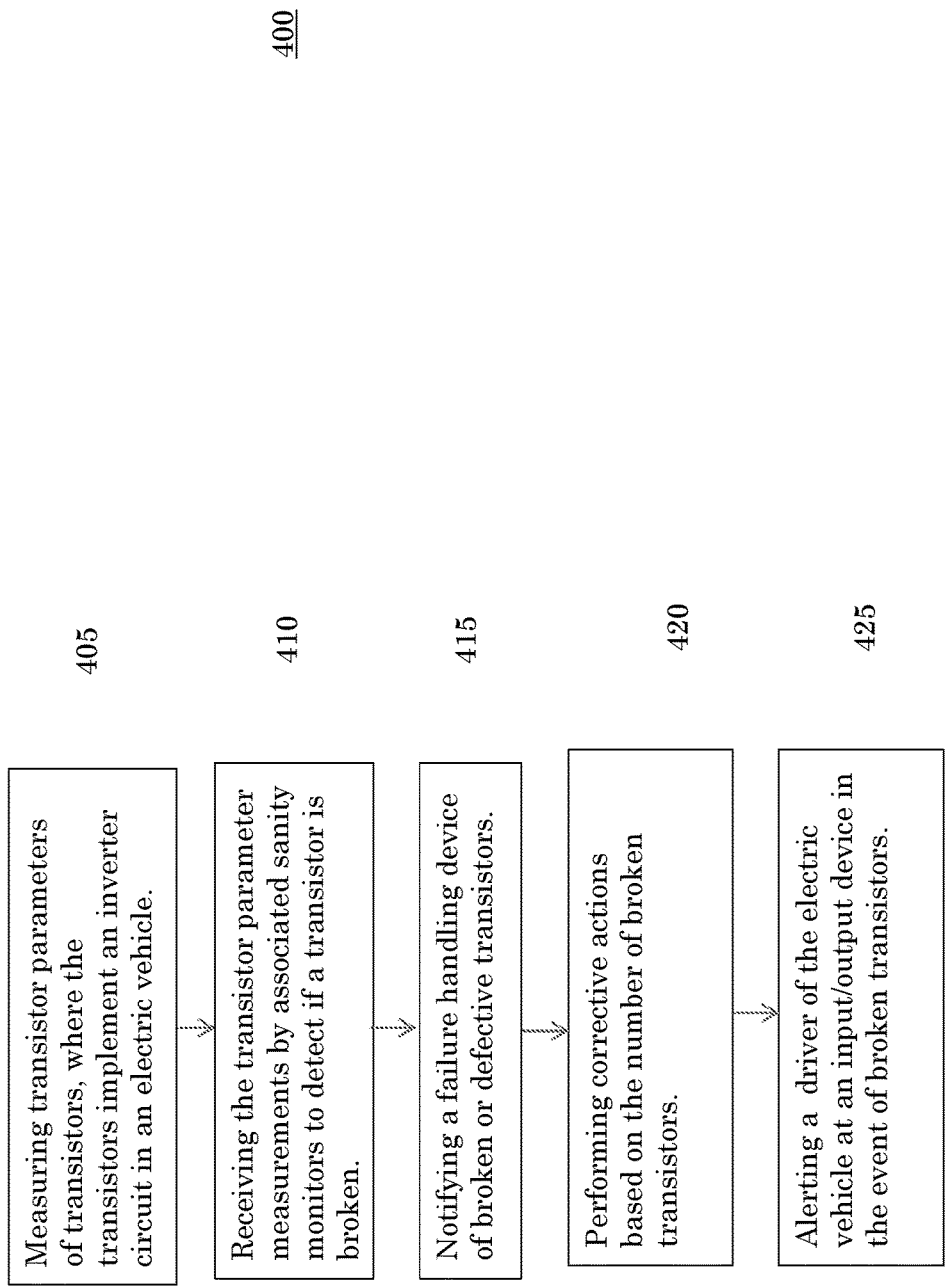
FIG. 4 is an illustrative method for implementing a sanity monitor in accordance with certain implementations.

FIG. 4 is an illustrative method 400 for monitoring transistors in a power module using a sanity monitor in accordance with certain implementations. Sensors measure transistor parameters of associated transistors, where the transistors implement an inverter circuit in an electric vehicle (step 405). The transistor parameter measurements are received by associated sanity monitors to detect if a transistor is broken or is close to breaking soon (step 410). In particular, the sanity monitors compare the measured transistor parameter values against expected transistor parameter values. The sanity monitors notify a failure handling device of broken or defective transistors (step 415). The failure handling device performs corrective actions based on the number of broken transistors (step 420). A driver of the electric vehicle is alert at an input/output device in the event of broken transistors (step 425).

In general, a sanity monitoring system includes at least one sensor connected to each transistor in an inverter circuit configuration, where each sensor measures a transistor parameter. The system further includes a sanity monitor which is connected to each sensor. The sanity monitor determines a defective transistor based on at least one measured transistor parameter. The system further includes a failure handling device connected to each sanity monitor. The failure handling device performs a corrective action based on detection of at least one defective transistor. In an implementation, the at least one sensor is a voltage sensor, a current sensor, a temperature sensor and a magnetic field sensor. In an implementation, the at least one sensor is a plurality of sensors including at least two sensors from a voltage sensor, a current sensor, a temperature sensor and a magnetic field sensor. In an implementation, the corrective action reduces an operating current to a predetermined level based on a number of defective transistors. In an implementation, the sanity monitoring system further includes an input/output device connected to the failure handling device. The input/output device provides an alert to a driver of the electric vehicle in the event the failure handling device reports at least one defective transistor. In an implementation, the corrective action reduces engine torque based on a number of defective transistors. In an implementation, the corrective action keeps one or more defective transistors from being turned on.

In general, a method for monitoring transistors in a power module includes measuring, via at least one sensor, at least one transistor parameter for each of a plurality of transistors, where the plurality of transistors implement inverter circuits in an electric vehicle; receiving, at a sanity monitor associated with the at least one sensor, a transistor parameter measurement to detect if a transistor is broken; notifying, by the sanity monitor, a failure handling device in the event of at least one defective transistor; and performing, by the failure handling device, a corrective action in the event of the at least one defective transistor. In an implementation, the method includes comparing, by the sanity monitor, the transistor parameter measurement against expected transistor parameter values to detect a defective transistor. In an implementation, the at least one sensor is a voltage sensor, a current sensor, a temperature sensor and a magnetic field sensor. In an implementation, the at least one sensor is a plurality of sensors including at least two sensors from a voltage sensor, a current sensor, a temperature sensor and a magnetic field sensor. In an implementation, the corrective action reduces an operating current to a predetermined level based on a number of defective transistors. In an implementation, the method further includes alerting a driver of the electric vehicle in the event the failure handling device reports at least one defective transistor. In an implementation, the corrective action reduces engine torque based on a number of defective transistors. In an implementation, the corrective action keeps one or more defective transistors from being turned on.

In general, an electric vehicle includes an electric motor, and an inverter connected to the electric motor. The inverter includes at least one power module, a battery pack connected to the inverter, a sanity monitoring system connected to the inverter and a controller connected to at least the electric motor, the inverter, the battery pack and the sanity monitor. The controller controls an amount of operating current provided to the electric motor from the battery pack via the inverter. The sanity monitoring system includes at least one sensor connected to each transistor in the at least one power module, where each sensor measures a transistor parameter. The sanity monitoring system further includes a sanity monitor connected to each sensor. The sanity monitor determines a defective transistor based on at least one measured transistor parameter. The sanity monitoring system further includes a failure handling device connected to each sanity monitor. The failure handling device performs a corrective action based on detection of at least one defective transistor. In an implementation, the at least one sensor is a voltage sensor, a current sensor, a temperature sensor and a magnetic field sensor. In an implementation, the at least one sensor is a plurality of sensors including at least two sensors from a voltage sensor, a current sensor, a temperature sensor and a magnetic field sensor. In an implementation, the corrective action reduces the operating current supplied the electric motor to a predetermined level based on a number of defective transistors. In an implementation, the electric vehicle further includes an input/output device connected to the failure handling device. The input/output device provides an alert to a driver of the electric vehicle in the event the failure handling device reports at least one defective transistor. In an implementation, the corrective action reduces engine torque based on a number of defective transistors. In an implementation, the controller includes the failure handling device. In an implementation, the corrective action keeps one or more defective transistors from being turned on.

Having thus described the presently preferred embodiments in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiments and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

It should be understood that many variations are possible based on the disclosure herein. Although features and elements are described above in particular combinations, each feature or element may be used alone without the other features and elements or in various combinations with or without other features and elements.

What is claimed is:

1. A sanity monitoring system, comprising:
   at least one sensor connected to each transistor in an inverter circuit configuration, wherein each sensor is configured to measure a transistor parameter;
   a sanity monitor connected to each sensor, wherein the sanity monitor is configured to determine a defective transistor based on at least one measured transistor parameter; and
   a failure handling device connected to each sanity monitor, wherein the failure handling device is configured to perform a corrective action based on a detection of at least one defective transistor, and wherein the corrective action deactivates the defective transistor of the inverter circuit and reduces an overall amount of current output by non-defective transistors of the inverter circuit.

2. The sanity monitoring system of claim 1, wherein the at least one sensor is a voltage sensor, a current sensor, a temperature sensor and a magnetic field sensor.

3. The sanity monitoring system of claim 1, wherein the at least one sensor is a plurality of sensors including at least two sensors from a voltage sensor, a current sensor, a temperature sensor and a magnetic field sensor.

4. The sanity monitoring system of claim 1, wherein the corrective action reduces an overall amount of operating current of the inverter circuit to a predetermined level that is greater than zero based on a number of defective transistors.

5. The sanity monitoring system of claim 1, further comprising:
an input/output device connected to the failure handling device, wherein the input/output device is configured to provide an alert to a driver of the electric vehicle in the event the failure handling device reports at least one defective transistor.

6. The sanity monitoring system of claim 1, wherein the corrective action reduces an amount of torque provided by an electric motor to a predetermined level based on a number of defective transistors.

7. The sanity monitoring system of claim 1, wherein the corrective action keeps one or more defective transistors from being turned on.

8. A method for monitoring transistors in a power module, the method comprising:
measuring, via at least one sensor, at least one transistor parameter for each of a plurality of transistors, where the plurality of transistors implements one or more inverter circuits of the power module in an electric vehicle;
receiving, at a sanity monitor associated with the at least one sensor, a transistor parameter measurement, wherein a transistor is determined to be defective based on the received transistor parameter measurement;
providing a notification, by the sanity monitor, to a failure handling device in the event that at least one transistor is determined to be defective; and
performing, by the failure handling device, a corrective action based on the at least one defective transistor, wherein the corrective action deactivates the at least one defective transistor of the inverter circuit and reduces an overall amount of current output by the power module.

9. The method of claim 8, further comprising:
comparing, by the sanity monitor, the transistor parameter measurement to an expected transistor parameter value to detect a defective transistor.

10. The method of claim 8, wherein the at least one sensor is a voltage sensor, a current sensor, a temperature sensor and a magnetic field sensor.

11. The method of claim 8, wherein the at least one sensor is a plurality of sensors including at least two sensors from a voltage sensor, a current sensor, a temperature sensor and a magnetic field sensor.

12. The method of claim 8, wherein the corrective action reduces an overall amount of operating current of the power module to a predetermined level that is greater than zero based on a number of defective transistors.

13. The method of claim 8, further comprising:
providing an alert to a driver of the electric vehicle in the event the failure handling device determines that at least one defective transistor exists.

14. The method of claim 8, wherein the corrective action reduces an amount of torque provided by an electric motor based on a number of defective transistors.

15. The method of claim 8, wherein the corrective action keeps one or more defective transistors from being turned on.

16. An electric vehicle comprising:
an electric motor;
an inverter connected to the electric motor, the inverter including at least one power module;
a battery pack connected to the inverter;
a sanity monitoring system connected to the inverter; and
a controller connected to at least the electric motor, the inverter, the battery pack and the sanity monitor, wherein the controller controls an amount of operating current provided to the electric motor from the battery pack via the inverter, and
wherein the sanity monitoring system includes:
at least one sensor connected to each transistor in the at least one power module, wherein each sensor measures a transistor parameter;
a sanity monitor connected to each sensor, wherein the sanity monitor determines a defective transistor based on at least one measured transistor parameter; and
a failure handling device connected to each sanity monitor, wherein the failure handling device performs a corrective action based on a detection of at least one defective transistor, and wherein the corrective action deactivates the defective transistor of the inverter circuit and reduces an overall amount of current output by non-defective transistors of the inverter circuit.

17. The electric vehicle of claim 16, wherein the at least one sensor is a voltage sensor, a current sensor, a temperature sensor and a magnetic field sensor.

18. The electric vehicle of claim 16, wherein the at least one sensor is a plurality of sensors including at least two sensors from a voltage sensor, a current sensor, a temperature sensor and a magnetic field sensor.

19. The electric vehicle of claim 18, wherein the corrective action reduces the operating current supplied to the electric motor to a predetermined level based on a number of defective transistors.

20. The electric vehicle of claim 16, further comprising:
an input/output device connected to the failure handling device, wherein the input/output device provides an alert to a driver of the electric vehicle in the event the failure handling device reports at least one defective transistor.

21. The electric vehicle of claim 16, wherein the corrective action reduces an amount of torque provided by the electric motor based on a number of defective transistors.

22. The electric vehicle of claim 16, the controller includes the failure handling device.

23. The electric vehicle of claim 16, wherein the corrective action keeps one or more defective transistors from being turned on.

* * * * *

UNITED STATES PATENT AND TRADEMARK OFFICE
CERTIFICATE OF CORRECTION

PATENT NO. : 10,144,292 B2
APPLICATION NO. : 15/393527
DATED : December 4, 2018
INVENTOR(S) : Robert Herb Page 1 of 1

It is certified that error appears in the above-identified patent and that said Letters Patent is hereby corrected as shown below:

On the Title Page

Item (57) Abstract:
On Line 12, please delete "handing" and insert --handling-- therein.

Signed and Sealed this
Twenty-fourth Day of September, 2019

Andrei Iancu
*Director of the United States Patent and Trademark Office*